United States Patent [19]

Cook

[11] Patent Number: 5,672,433
[45] Date of Patent: Sep. 30, 1997

[54] MAGNESIUM COMPOSITE ELECTRONIC PACKAGES

[75] Inventor: Arnold J. Cook, Mt. Pleasant, Pa.

[73] Assignee: PCC Composites, Inc., Pittsburgh, Pa.

[21] Appl. No.: 558,945

[22] Filed: Nov. 13, 1995

Related U.S. Application Data

[63] Continuation of Ser. No. 72,415, Jun. 2, 1993, abandoned.

[51] Int. Cl.[6] .................................. C22C 15/00
[52] U.S. Cl. .................. 428/469; 428/472; 428/614; 428/698; 428/704
[58] Field of Search .......................... 428/472, 469, 428/698, 704, 614; 174/255

[56] References Cited

U.S. PATENT DOCUMENTS

| | | | |
|---|---|---|---|
| 4,341,965 | 7/1982 | Okuo et al. | 428/698 |
| 4,595,638 | 6/1986 | Dohnomoto et al. | 428/614 |
| 4,609,586 | 9/1986 | Jensen et al. | 428/901 |
| 4,749,545 | 6/1988 | Begg et al. | 419/13 |
| 4,759,995 | 7/1988 | Skibo et al. | 428/614 |
| 4,894,088 | 1/1990 | Yamuguchi et al. | 75/232 |
| 4,941,918 | 7/1990 | Horikoshi et al. | 75/229 |
| 4,961,778 | 10/1990 | Pyzik et al. | 75/230 |
| 5,039,577 | 8/1991 | Knoell et al. | 428/614 |
| 5,143,795 | 9/1992 | Das et al. | 428/614 |
| 5,249,620 | 10/1993 | Guerriero et al. | 164/97 |
| 5,273,569 | 12/1993 | Yilman et al. | 75/230 |
| 5,287,248 | 2/1994 | Montesano | 361/708 |
| 5,306,571 | 4/1994 | Dolowy, Jr. et al. | 174/252 |
| 5,435,825 | 7/1995 | Kusui et al. | 75/249 |

Primary Examiner—Archene Turner
Attorney, Agent, or Firm—Klarquist Sparkman Campbell Leigh & Whinston, LLP

[57] ABSTRACT

The present invention is a system comprising an element having a specific coefficient of thermal expansion and a metal matrix composite having a coefficient of thermal expansion which essentially matches that of the element. The composite is in contact with the element such that heat can be transferred therebetween. The composite comprises reinforcement material infiltrated with a matrix material having magnesium or a magnesium alloy. If desired, inserts may be loaded into the mold to create specific features in the resulting composite. Other inserts such as other metals, tubes or leachable cores may be used to create features inside of the magnesium composite such as metal seal rings made out of kovar or stainless steel cooling channels or substrates. Preferably, magnesium is infiltrated, assisted by pressure, into reinforcement material to form a metal matrix composite comprised of a reinforcement material infiltrated with matrix material surrounded by a pure metal skin of magnesium. These magnesium composites with hermetic skins are ideal for many applications including electronic packages for housing an electronic component because they offer lighter weight and high conductivity. The present invention is also a method which comprises the steps of forming a metal matrix composite comprised of reinforcement material filled with a matrix material having magnesium such that the composite has a specific coefficient of thermal expansion. Then, there is the step of connecting an element, such as an electronic device, having a coefficient of thermal expansion which essentially matches that of the composite to the composite.

43 Claims, 5 Drawing Sheets

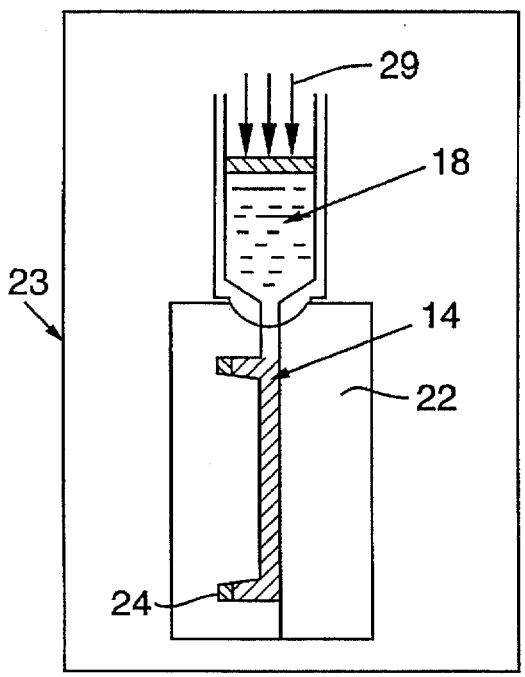
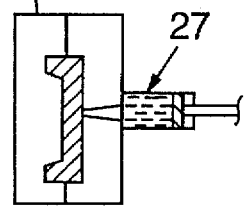
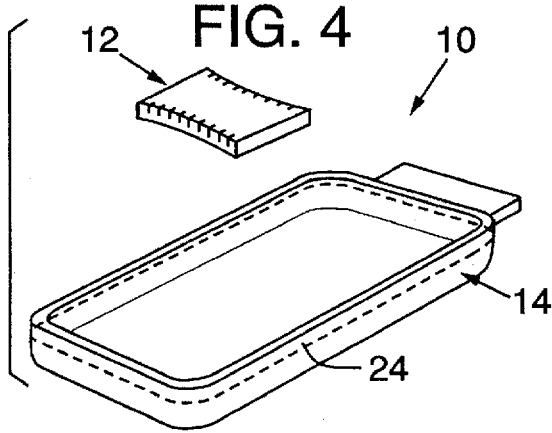
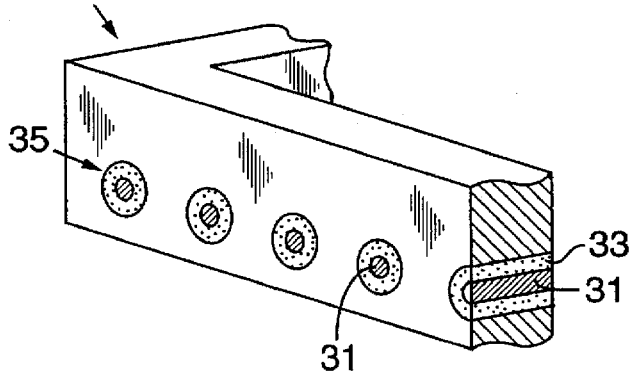
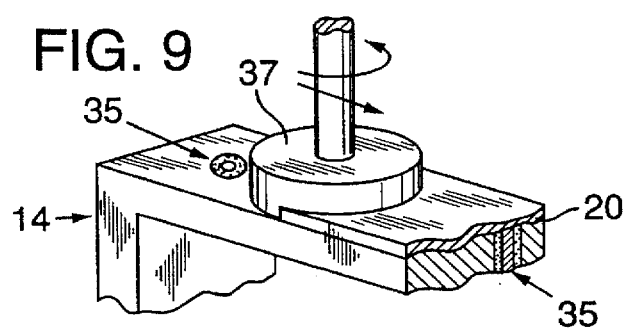

MAGNESIUM COMPOSITE ELECTRONIC PACKAGES

This application is a continuation of application Ser. No. 08/072,415 filed on Jun. 2, 1993, now abandoned.

FIELD OF THE INVENTION

The present invention relates to electronic packages, substrates and heat sinks. More specifically, the invention relates to material systems based on a magnesium matrix composite produced by using pressurized liquid magnesium to infiltrate a reinforcement and form a electronic component.

BACKGROUND OF THE INVENTION

Electronic packages and substrates require a high thermal conductivity to remove heat from the encased electronics so the electronics can operate properly. They also require a thermal expansion coefficient (CTE) matched to devices and electronics that are attached to it so there is no separation therebetween during temperature changes. These devices include silicon, alumina, and gallium arsenide devices which have a thermal expansion coefficient of 5 to 6.8 ppm/°C. In the past, materials, such as kovar, or ceramics, such as alumina, have been used to support these devices. Often times, aluminum packages, substrates and heat sinks are used by placing a silicon or gallium arsenide device onto a CTE matched material such as kovar. These devices are then mounted with screws, cement or another compliant material to the aluminum. These systems keep silicon and gallium arsenide devices from snapping off the package during thermal cycling. Aluminum has a high CTE of approximately 24, almost 5 times greater than silicon. If silicon is mounted directly to aluminum, the silicon will crack off the aluminum due to the induced stresses where the system is heated.

Recently, metal matrix composites have been introduced as electronic packaging material. These include aluminum silicon carbide, copper molybdenum and copper tungsten. Most of these are produced by powder metallurgy. Also, aluminum silicon carbide may be produced by pressureless infiltration or pressure assisted infiltration. Composite materials are of interest because high conductivity systems with low CTE's are possible. For electronic packages, they offer the ability to tailor material properties for a specific application.

In many such applications, light weight is also of considerable interest. Aluminum silicon carbide can be used to create high thermal conductivity packages with a CTE close to a alumina and a density only slightly higher than aluminum. Aluminum silicon carbide has shown great promise as a future material system. There are, however, other material systems which can produce better performance than aluminum silicon carbide and the other materials being used currently for electronic packaging. Aluminum silicon carbide is just starting to be accepted as a packaging material because of problems that exist with plating and corrosion.

SUMMARY OF THE INVENTION

The present invention is a system comprising an element having a specific coefficient of thermal expansion and a metal matrix composite having a coefficient of thermal expansion which essentially matches that of the element. The composite is in contact with the element such that heat can be transferred therebetween. The composite comprises reinforcement material filled with a matrix material having magnesium or a magnesium alloy. The reinforcement material is preferably comprised of reinforcement particles. The composite preferably has a base with at least one wall that extends at an angle from the base. Preferably, the matrix material forms a continuum between the base and the one wall.

If desired, inserts may be loaded into the mold to create specific features in the resulting composite. Other inserts such as other metals, tubes or leachable cores may be used to create features inside of the magnesium composite such as metal seal rings made out of kovar or stainless steel cooling channels or substrates.

Preferably, magnesium is infiltrated, assisted by pressure, into reinforcement material to form a metal matrix composite comprised of a reinforcement material infiltrated with matrix material surrounded by a pure metal skin of magnesium. These magnesium composites with hermetic skins are ideal for many applications including electronic packages for housing an electronic component because they offer lighter weight and high conductivity.

The present invention is also a method which comprises the steps of forming a metal matrix composite comprised of reinforcement material filled with a matrix material having magnesium such that the composite has a specific coefficient of thermal expansion. Then, there is the step of connecting an element, such as an electronic device, having a coefficient of thermal expansion which essentially matches that of the composite

BRIEF DESCRIPTION OF THE DRAWINGS

In the accompanying drawings, the preferred embodiment of the invention and preferred methods of practicing the invention are illustrated in which:

FIGS. 3a and 3b are schematic representations showing two methods of forcing liquid magnesium into a reinforcement contained in a mold.

FIG. 4 is a schematic representation of a magnesium composite electronic package.

FIG. 8 is a schematic representation showing a composite with cast-in electrical feed-throughs.

FIG. 9 is a schematic representation showing a composite being grinded to expose cast-in feed-throughs.

DESCRIPTION OF THE PREFERRED EMBODIMENT

Figure 1A:
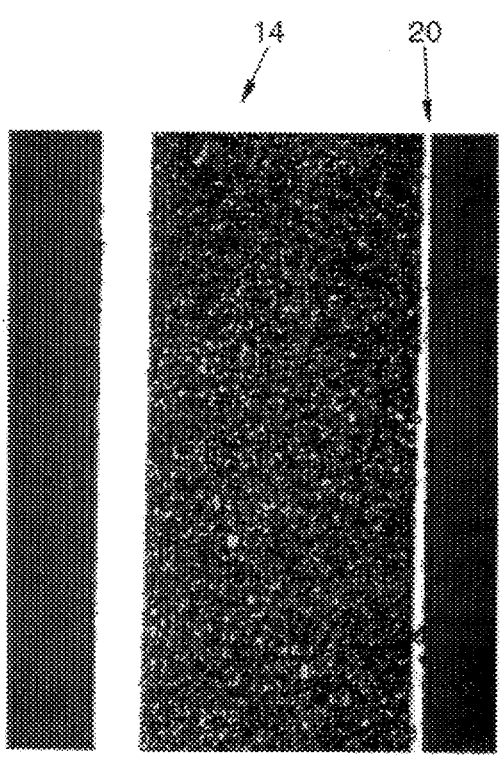
FIGS. 1a and 1b show cross sections of an electronic package made of magnesium cubic boron nitride at 50× magnification and 200× magnification, respectively.
Figure 1B:
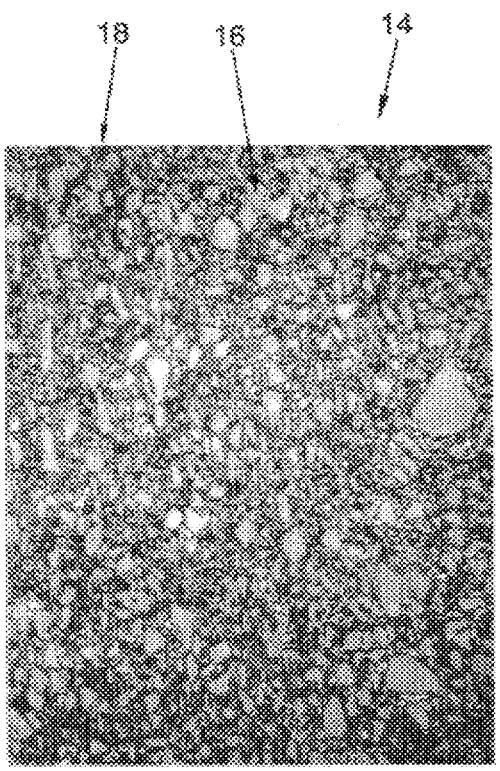

Referring now to the drawings wherein like reference numerals refer to similar or identical parts throughout the several views, and more specifically to FIG. 4 thereof, there is shown a system 10 comprising an element 12 having a specific coefficient of thermal expansion and a metal matrix composite 14 having a coefficient of thermal expansion which essentially matches that of the element 12. The composite 14 is in contact with the element 12 such that heat can be transferred therebetween. As shown in FIGS. 1a and 1b, the composite 14 comprises reinforcement material 16 filled with a matrix material 18 having magnesium or a magnesium alloy.

Figure 5:
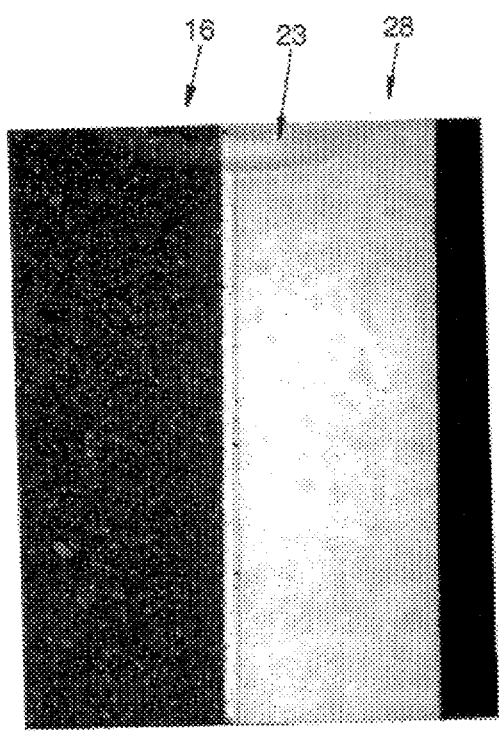
FIG. 5 shows a cross section of a component containing a cast-in seal ring at 50× magnification.
Figure 6:
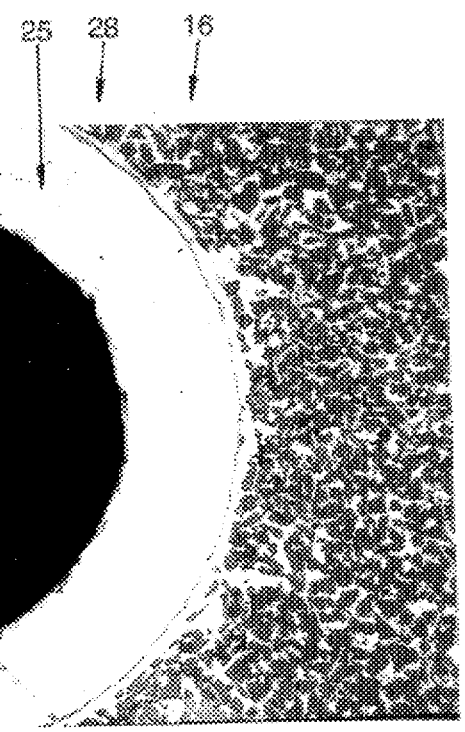
FIG. 6 shows a cross section of a component containing a cast-in cooling channel at 50× magnification.
Figure 7:
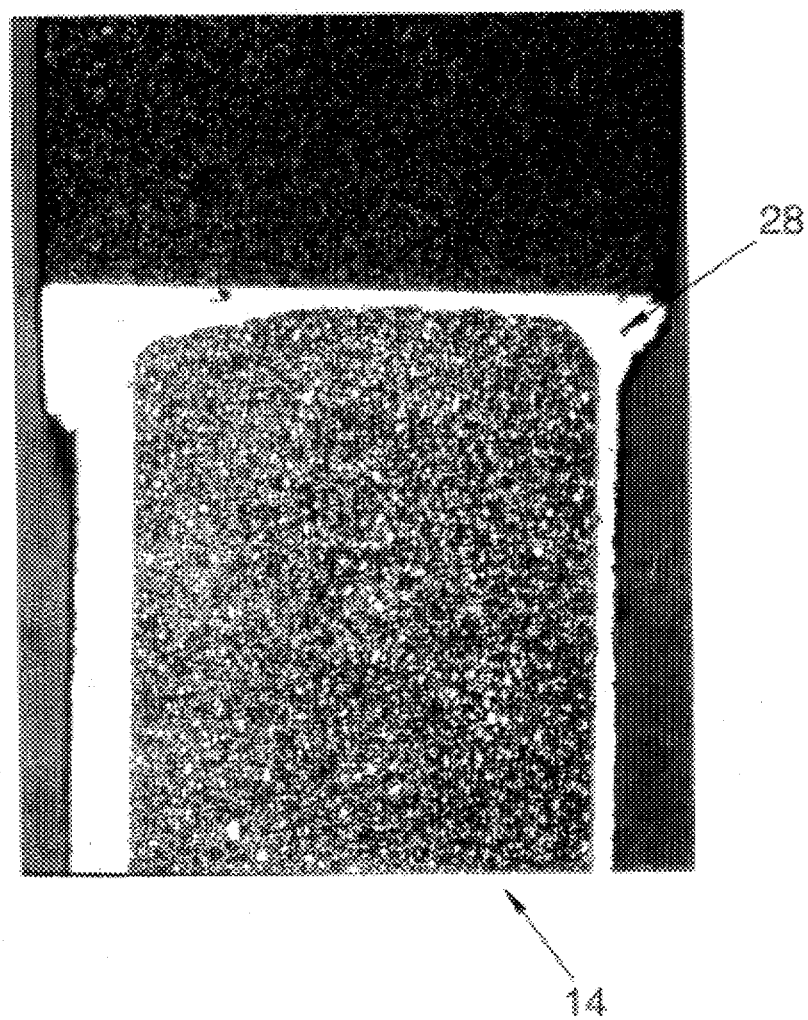
FIG. 7 shows a cross section of a component containing a cast-in ceramic insert at 50× magnification.

If desired, as shown in FIGS. 5–8, inserts 28 may be loaded into the mold 22 to create specific features in the resulting composite 14. Inserts 28 such as other metals, tubes or leachable cores may be used to create features inside of the magnesium composite 14, such as metal seal rings 23 made out of kovar or stainless steel, cooling channels 25 or substrates. FIG. 5 shows a magnesium composite 14 having a cast-in seal ring 23. The seal ring 23 can provide, for instance, a suitable welding surface for attaching a sealed cover. FIG. 6 shows a composite 14 with a cast-in cooling channel 25. FIG. 7 shows a ceramic insert 28 cast into the composite 14. Also, as shown in FIG. 8, inserts 28 containing conductors 31 and 33 may be loaded into the mold cavity 22 and infiltrated with liquid magnesium 18 to form a magnesium composite 14 with captured electrical feed-throughs 35. As shown in FIG. 9, after removal from the mold 22, the ends of the feed-through 35 may be cleaned using a grinder 35 to remove any skin 20 of magnesium. 35. This will create a hermetic cast-in electrical feed-through. Alumina made of near 100% dense material may be used as the insulator 33.

Preferably, magnesium is infiltrated, assisted by pressure, into reinforcement material 16 to form a metal matrix composite 14 comprised of a reinforcement material 16 infiltrated with matrix material 18 surrounded by a pure metal skin 20 of magnesium. These magnesium composites 14 with hermetic skins 20 are ideal for many applications including electronic packages for housing an electronic component because they offer lighter weight and high conductivity.

Figure 2A:
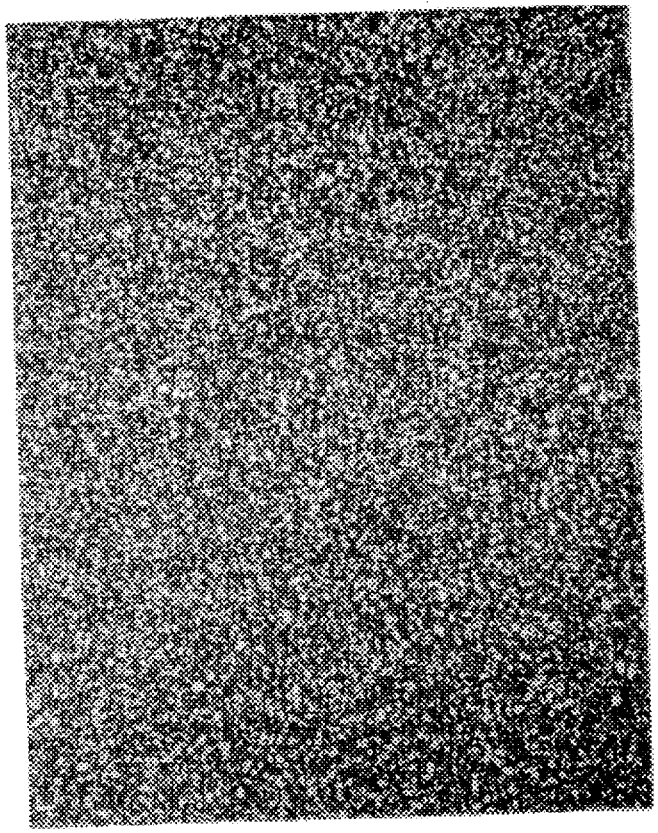
FIGS. 2a and 2b show cross sections of a magnesium silicon carbide electronic component at 50× magnification and 200× magnification, respectively.
Figure 2B:
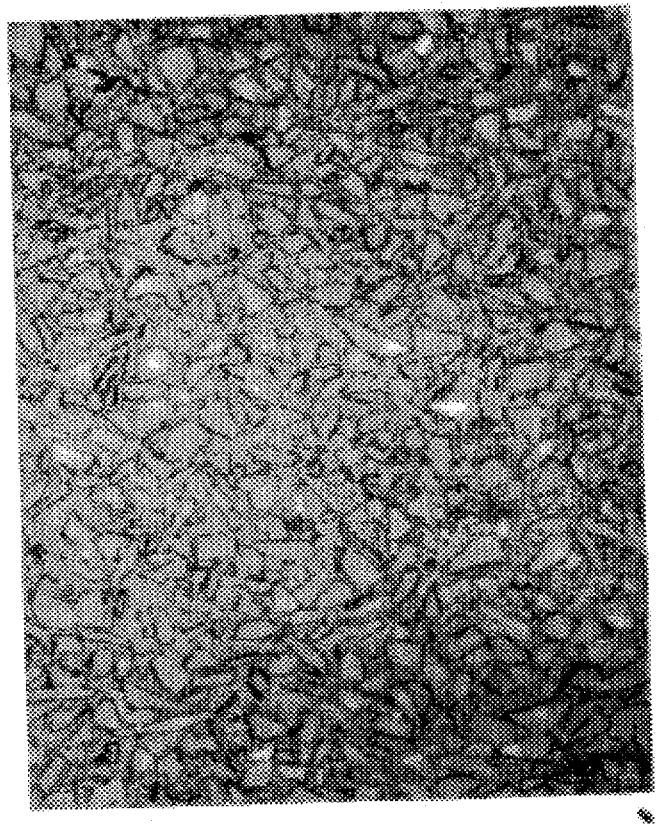

In a preferred embodiment, the reinforcement 16 is a high thermal conductivity and low CTE material such as cubic boron nitride, graphite, aluminum nitride, silicon carbide, or a ceramic such as diamond, or a metal. Of these, the highest thermal conductivity composite 14 is magnesium cubic boron nitride. FIGS. 1a and 1b show a magnesium cubic boron nitride composite 14 at 50× magnification and at 200× magnification, respectively. FIGS. 2a and 2b show a magnesium silicon carbide composite 14 at 50× magnification and at 200× magnification, respectively. Preferably, the reinforcement material 16 has a volume fraction of at least 50%.

To form the magnesium composite 14, as shown in FIGS. 3a and 3b, reinforcement material 16 is formed into the shape of a preform and loaded into a mold cavity 22 either by direct placement or by a single die process as described in U.S. Pat. No. 5,183,096, incorporated by reference. The mold cavity 22 is then evacuated and heated. Magnesium 18 is then forced into the reinforcement material 16 such as with gas pressure 29, for instance, as described in U.S. Pat. No. 5,111,870, incorporated by reference, as shown in FIG. 3a, or a mechanical ram 27, as shown in FIG. 3b. The resulting composite 16 can be made with a pure magnesium skin 20 so long as the reinforcement material 16 is not attached to the mold wall. The natural movement of the molten magnesium 18 in such circumstances surrounds the reinforcement material 16 resulting in the pure metal skin 20. The resulting magnesium composite 14 will have the combined properties of both the reinforcement material 16 and magnesium 18 and can be made to match the CTE of silicon or gallium arsenide with a higher thermal conductivity and a lower density than aluminum. Magnesium composites 14 are preferable to aluminum composites due to the lower density and due to the lower reactivity to other materials. Once a composite 14 is produced, it can be gold plated by first depositing a flash of copper, then nickel, followed by gold. This technique offers better corrosion protection than the nickel/gold plating alone as used on aluminum silicon carbide composites.

The present invention is also a method which comprises the steps of forming a metal matrix composite 14 comprised of reinforcement material 16 filled with a matrix material 18 having magnesium such that the composite 14 has a specific coefficient of thermal expansion. Then, there is the step of connecting an element 12, such as an electronic device, having a coefficient of thermal expansion which essentially matches that of the composite to the composite 14. Preferably, the forming step includes the step of forcing molten matrix material 18 into the reinforcement material 16.

In one embodiment, as shown in FIG. 3a, before the forcing step, there is the step of disposing a mold 22 containing the reinforcement material 16 within a pressure vessel 23 and the forcing step includes the step of pressurizing the pressure vessel 23 such that molten matrix material 18 is forced into the mold 22 and the reinforcement material 16.

Alternatively, as shown in FIG. 3b, before the forcing step, there is the step of disposing the reinforcement material 16 within a mold 22 and the forcing step includes the step of forcing molten matrix material 18 and reinforcement material 16 with a ram 27 into the mold 22. It should be appreciated that any suitable casting device can be used to force the matrix material 18 into the reinforcement 16. Preferably, the connecting step includes the step of attaching an electronic component 12, such as an electronic chip, to the composite 14.

Preferably, before the attaching step, there are the steps of plating the composite 14 with copper and then plating the composite 14 with nickel and gold to form a corrosion protection layer. The step of plating the composite 14 with copper can include the step of plating the composite 14 with copper flash.

Preferably, the forming step includes the step of mixing magnesium 18 with reinforcement material 16. The magnesium 18 can be a liquid or powder. If desired, the mixing step can include the step of adding flow agent, such as wax, and the forming step includes the step of injection molding the magnesium 18, reinforcement material 16 and flow agent. Preferably, the forming step includes the step of sintering the composite 14 and hot isostatic pressing the composite 14 to full density.

In the operation of the preferred embodiment, and with reference to FIG. 4, there is shown a composite 14 having reinforcement material 16 infiltrated with magnesium 18. The reinforcement material 16 is cubic boron nitride particles between 1 micron and 300 microns in diameter. The particles may be varied in size to create different volume fractions of reinforcement 16. Larger particle size produce higher thermal conductivity. The preferred embodiment utilizes particles in the range of 100 to 200 microns of a volume fraction of between 50% and 60% to produce a reinforced composite 14 with a CTE matched to alumina and a thermal conductivity of over 350 watts per meter per degree K. This thermal conductivity is almost twice the thermal conductivity of aluminum silicon carbide metal matrix composites. The reinforcement particles 16 are formed into a preform and the preform is loaded into a mold cavity 22. The mold cavity 22 may be incorporated in a die casting machine or other pressure casting equipment such as a Pressure Infiltrating Apparatus as disclosed in U.S. Pat. No. 5,111,871. The reinforcement material 16 is heated and evacuated within the mold cavity 22. Liquid magnesium is then forced into the mold cavity 22, first traveling along the walls of the mold cavity 22 and then penetrating into the reinforcement material 16. The magnesium metal 18 is forced into the reinforcement material 16 by pressure exerted from a gas (or mechanical ram such as used in a die caster). The electronic package 14 has a base 17 and at least one wall 19 which extends at an angle from the base 17. The matrix material forms a continuum between the base 17 and the one wall 19. The resulting composite electronic package 14 may be made with cast-in inserts 24 such as a cast-in seal ring 24, as shown in FIG. 5, placed into the mold cavity 22 during casting resulting in a cast-in welding surface for hermetic sealing. In another preferred embodiment, silicon carbide or another material system may be used as reinforcement material 16.

In another preferred embodiment, magnesium 18 and reinforcement material 16 may be mixed together and then formed into the shape of an electronic component. Reinforcement particles 16 may be mixed into liquid magnesium 18 and then cast into the shape of an electronic component, by die casting or squeeze casting. Alternatively, reinforcement particles 16 and solid magnesium particles 18 may be mixed together and then pressed or mixed with a flow agent, such as wax, and then injection molded into the shape of an electronic component and then sintered or hot isostatically pressed to full density.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. A system comprising:
   an electronic component having a specific coefficient of thermal expansion; and
   a cast metal matrix composite having a coefficient of thermal expansion which essentially matches that of the element, said composite in contact with said electronic component such that heat can be transferred therebetween, said composite comprising reinforcement particles filled with a cast matrix material having magnesium.

2. A system as described in claim 1 wherein the composite has a skin of pure matrix material.

3. A system as described in claim 1 wherein the particles are between 1 micron and 300 microns in diameter.

4. A system as described in claim 1 wherein the matrix material comprises a magnesium alloy.

5. A system as described in claim 1 wherein the reinforcement particles comprise boron nitride particles.

6. A system as described in claim 5 wherein the reinforcement particles comprise cubic boron nitride particles.

7. A system as described in claim 1 wherein the reinforcement particles comprise graphite particles.

8. A system as described in claim 1 wherein the reinforcement particles comprise a ceramic particles.

9. A system as described in claim 1 wherein the reinforcement particles have a volume fraction of at least 50%.

10. A system as described in claim 1 wherein the reinforcement particles comprise silicon carbide particles.

11. A system as described in claim 1 wherein the reinforcement particles comprise silicon carbide particles and cubic boron nitride particles.

12. A system as described in claim 1 wherein the reinforcement particles comprise aluminum nitride particles.

13. A system as described in claim 1 wherein the reinforcement particles comprise a metal.

14. A system as described in claim 13 wherein the metal of the reinforcement particles have a volume fraction of at least 50%.

15. A system as described in claim 1 wherein the composite includes inserts required for the electronic component.

16. A system as described in claim 15 wherein the composite includes cast-in feed-throughs.

17. A system as described in claim 15 wherein the composite includes a cast-in seal ring.

18. A system as described in claim 15 wherein the composite includes cast-in cooling channels.

19. A system as described in claim 15 wherein the composite includes cast-in substrates.

20. A system comprising:
   an electronic component having a specific coefficient of thermal expansion; and
   a cast metal matrix composite having a coefficient of thermal expansion which essentially matches that of the element, said composite in contact with said electronic component such that heat can be transferred therebetween, said composite comprising reinforcement material filled with a cast matrix material having magnesium, said composite having a base and at least one wall that extends at an angle from the base, said cast matrix material forming a continuum between said base and said one wall.

21. A system as described in claim 20 wherein the reinforcement material is reinforced particles.

22. A system as described in claim 20 wherein the composite has a skin of pure matrix material.

23. A system as described in claim 20 wherein the matrix material comprises a magnesium alloy.

24. A system as described in claim 20 wherein the reinforcement comprises boron nitride.

25. A system as described in claim 24 wherein the reinforcement comprises cubic boron nitride.

26. A system as described in claim 20 wherein the reinforcement comprises graphite.

27. A system as described in claim 20 wherein the reinforcement comprises a ceramic.

28. A system as described in claim 20 wherein the composite includes inserts required for the electronic component.

29. A system as described in claim 28 wherein the composite includes cast-in feed-throughs.

30. A system as described in claim 28 wherein the composite includes a cast-in seal ring.

31. A system as described in claim 28 wherein the composite includes cast-in cooling channels.

32. A system as described in claim 28 wherein the composite includes cast-in substrates.

33. An electronic package for holding an electronic component having a specific coefficient of thermal expansion comprising:
   a cast metal matrix composite having a coefficient of thermal expansion which essentially matches that of the element, said composite in contact with said electronic component such that heat can be transferred therebetween, said composite comprising reinforcement material filled with a cast matrix material having magnesium, said composite having a base upon which the electronic component is disposed and at least one wall that extends at an angle from the base, said cast matrix material forming a continuum between said base and said one wall.

34. An electronic package as described in claim 33 wherein the reinforcement material is reinforced particles.

35. An electronic package as described in claim 34 wherein the composite includes inserts required for the electronic component.

36. An electronic package for holding an electronic component having a specific coefficient of thermal expansion comprising:
    a cast metal matrix composite having a coefficient of thermal expansion which essentially matches that of the element, said composite in contact with said electronic component such that heat can be transferred therebetween, said composite having a base upon which the electronic component is disposed, said composite comprising reinforcement particles filled with a cast matrix material having magnesium.

37. A system comprising:
    an electronic component having a specific coefficient of thermal expansion; and
    a cast metal matrix composite having a coefficient of thermal expansion which essentially matches that of the element, said composite in contact with said electronic component such that heat can be transferred therebetween, said composite comprising reinforcement particles filled with a cast matrix material having magnesium, said cast matrix forming a continuum throughout the composite.

38. A system comprising:
    an electronic component having a specific coefficient of thermal expansion; and
    a metal matrix composite having a coefficient of thermal expansion which essentially matches that of the element, said composite in contact with said electronic component such that heat can be transferred therebetween, said composite comprising a matrix material including magnesium having reinforcement particles therein, the reinforcement particles consisting essentially of a material selected from the group consisting of ceramics, graphite and diamond.

39. A system as described in claim 38, wherein the reinforcement particles consist essentially of boron nitride or silicon carbide.

40. A system comprising:
    an electronic component having a specific coefficient of thermal expansion; and
    a metal matrix composite having a coefficient of thermal expansion which essentially matches that of the element, said composite in contact with said electronic component such that heat can be transferred therebetween, said composite comprising at least 50 volume percent reinforcement particles filled with a matrix material having magnesium.

41. A metal matrix composite comprising:
    a cast matrix comprising magnesium; and
    reinforcement particles distributed within the cast matrix.

42. A metal matrix composite as described in claim 41, wherein the reinforcement particles consist essentially of a ceramic.

43. A metal matrix composite as described in claim 41, wherein the reinforcement particles comprise at least 50 volume percent of the metal matrix composite.

* * * * *